United States Patent [19]
Darbee et al.

[11] Patent Number: 5,481,256
[45] Date of Patent: Jan. 2, 1996

[54] DIRECT ENTRY REMOTE CONTROL WITH CHANNEL SCAN

[75] Inventors: Paul Darbee, Santa Ana, Calif.; Menno Buys, Hengelo, Netherlands

[73] Assignee: Universal Electronics Inc., Del.

[21] Appl. No.: 158,600

[22] Filed: Nov. 29, 1993

Related U.S. Application Data

[63] Continuation-in-part of Ser. No. 990,854, Dec. 11, 1992, which is a continuation-in-part of Ser. No. 913,523, Jul. 14, 1992, abandoned, which is a continuation-in-part of Ser. No. 586,957, Sep. 24, 1990, abandoned, which is a continuation of Ser. No. 127,999, Dec. 2, 1987, Pat. No. 4,959,810, which is a continuation-in-part of Ser. No. 109,336, Oct. 14, 1987, abandoned.

[51] Int. Cl.$^6$ ........................................... H04Q 1/00
[52] U.S. Cl. ................. 340/825.56; 340/825.22; 340/825.72
[58] Field of Search .............. 340/825.56, 825.03, 340/825.22, 825.69, 825.72; 341/176, 23; 455/151.2

[56] References Cited

U.S. PATENT DOCUMENTS

| | | | |
|---|---|---|---|
| 4,495,654 | 1/1985 | Deiss | 455/151.2 |
| 4,631,601 | 12/1986 | Brugliera et al. | |
| 4,825,200 | 4/1989 | Evans et al. | 341/23 |
| 4,856,081 | 8/1989 | Smith | 455/151.2 |

FOREIGN PATENT DOCUMENTS

2639499   5/1990   France .

*Primary Examiner*—Donald J. Yusko
*Assistant Examiner*—Edwin C. Holloway, III
*Attorney, Agent, or Firm*—Thomas R. Vigil; Larry J. Chapa

[57] ABSTRACT

The remote control comprises a microprocessor including a CPU and memory, a keypad including keys for operating the remote control coupled to the microprocessor, lamp driver circuitry coupled to the microprocessor, hardware and software, including the microprocessor, for generating infrared (IR) signals coupled to the IR lamp driver circuitry, code data for executing command functions for operating a home entertainment device stored in the memory. The keys include a SCAN key, circuitry for coupling the SCAN key to the microprocessor and a channel scan program stored in the memory for effecting a channel scan of channels when the SCAN key is depressed.

17 Claims, 6 Drawing Sheets

DIRECT ENTRY REMOTE CONTROL WITH CHANNEL SCAN

CROSS REFERENCE TO RELATED APPLICATIONS

This application is a continuation-in-part of U.S. application Ser. No. 07/990,854 filed on Dec. 11, 1992, which is a continuation-in-part of U.S. application Ser. No. 07/913,523 filed on Jul. 14, 1992, now abandoned, which is a continuation-in-part of U.S. application Ser. No. 07/586,957 filed on Sep. 24, 1990, now abandoned, which is a continuation of U.S. application Ser. No. 07/127,999 filed on Dec. 2, 1987, now U.S. Pat. No. 4,959,810, which is a continuation-in-part of U.S. application Ser. No. 07/109,336 filed on Oct. 14, 1987, now abandoned.

BACKGROUND OF THE INVENTION

1. Field of the Invention.

The present invention relates to a remote control for a television set which is of the type that has digit keys for the direct entry of a select channel but no channel "up" or "down" keys. Also, the software/programming of the remote control of the present invention be used in a remote control which has a channel "up" or "down" to "automate" the process of scanning channels thereby reducing the number of button/key presses required from the user.

2. Description of the related art including information disclosed under 37 CFR §§ 1.97–1.99.

Heretofore a variety of remote controls both dedicated and universal have been proposed for operating televisions, VCR and other consumer electronic equipment. Typically, such remote controls are provided with a keypad or keyboard with digit keys thereon and some with alphabet keys thereon.

In the United States most remote control devices also have channel "UP", channel "DOWN", volume "UP" and volume keys.

However in Europe and other countries around the world channel "UP" and channel "DOWN" keys often are not provided even though it is desirable to have this function. As will be described in greater detail hereinafter the remote control of the present invention has circuitry and executable programs which, upon detection of a special "SCAN" command such as by the depression of a certain key, e.g., a "SCAN" key, on the keypad automatically starts a step-through-channels operation pausing briefly at each channel and continuing without requiring any further input, e.g., the pressing of a key, by the user until commanded by the user to stop scanning, such as by the user depressing a key or taking other action.

This feature is desirable even for remote controls that have channel "UP" and channel "DOWN" keys since the ability to automate the process of scanning channels reduces the number of key or button presses required to be made by the user.

SUMMARY OF THE INVENTION

According to the present invention there is provided a remote control comprising a microprocessor including a CPU and memory, a keypad including keys for operating the remote control coupled to the microprocessor, lamp driver circuitry coupled to the microprocessor, hardware and software, including the microprocessor, for generating infrared (IR) signals coupled to the IR lamp driver circuitry, code data for executing command functions for operating a home entertainment device stored in the memory. The keys include a SCAN key, circuitry for coupling the SCAN key to the microprocessor and a channel scan program stored in the memory for effecting a channel scan of channels when the SCAN key is depressed.

DESCRIPTION OF THE PREFERRED EMBODIMENT(S)

Figure 1:
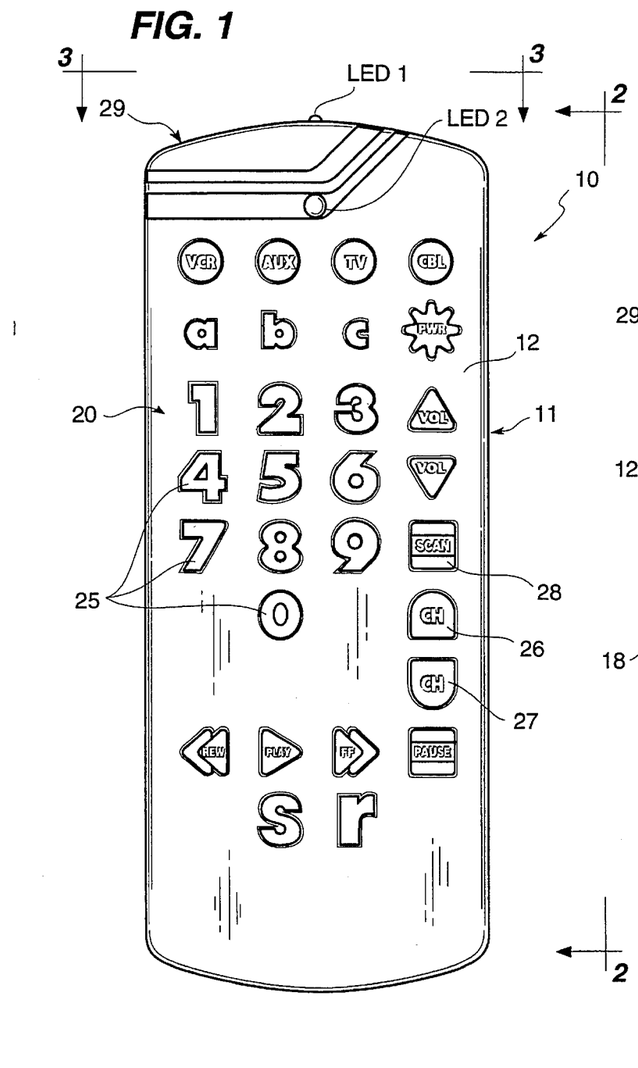
FIG. 1 is a top plan view of one remote control in which the channel scan system be incorporated.

Referring now to FIG. 1 in greater detail, there is illustrated therein a remote control 10 constructed according to the teachings of the present invention.

Figure 2:
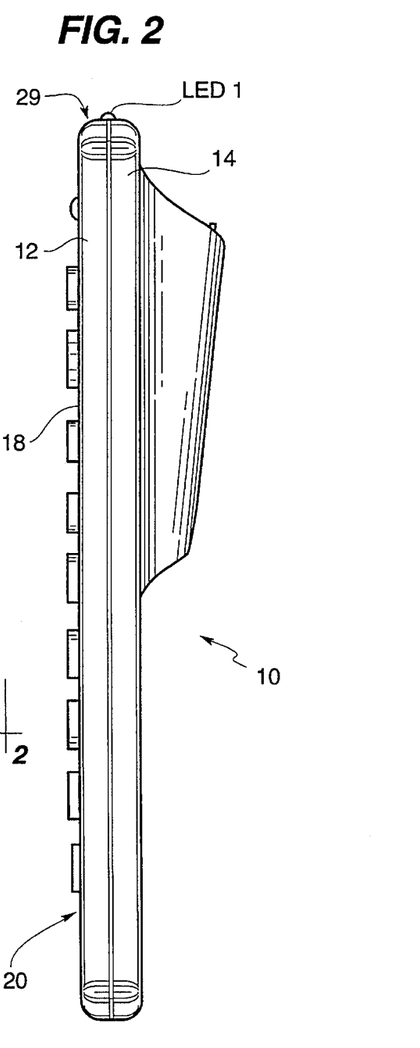
FIG. 2 is a side view of the remote control shown in FIG. 1 and is taken along line 2—2 of FIG. 1
Figure 3:
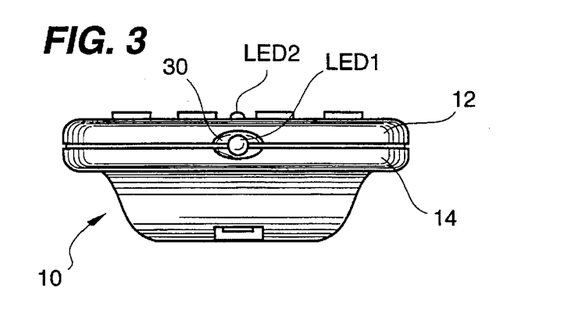
FIG. 3 is a front end view of the remote control shown in FIG. 1 and is taken along line 3—3 of FIG. 1.

As shown, the remote control 10 includes a housing 11 including an upper housing member 12, and a lower housing member 14 (FIG. 2 and FIG. 3). An overlay face panel 18 is positioned on the upper housing member 12 and has a keyboard layout, i.e. keypad, 20 on the outer surface thereof.

The panel 18 has openings therethrough for receiving elastomeric pushbuttons 25, for the keypad 20, all of which extend from and are fixed to or integral with an elastomeric body panel.

The pushbuttons or keys 25 are arranged in rows and columns and are identified as follows on the keypad 20:

| VCR | AUX | TV | CBL |
|-----|-----|-----|------|
| A | B | C | PWR |
| 1 | 2 | 3 | VOL |
| 4 | 5 | 6 | VOL |
| 7 | 8 | 9 | SCAN |
|   | 0 |   | CH |
|   |   |   | CH |
| REW | PLAY | FF | PAUSE |
|   | S | R |   |

The manner in which these pushbuttons 25, such as the "CHANNEL UP" key 26, the "CHANNEL DOWN" key 27 and a "SCAN" key 28, are utilized in operating the remote control 10 will be described in greater detail hereinafter. In some embodiments the channel "up" key 26 and channel "down" key 27 are omitted.

FIG. 2 is a side view of the remote control 10.

As shown in FIG. 3, at a top or forward end 29 (FIG. 1 and FIG. 2) of the remote control 10 there is provided an opening or window 30 for at least one infra-red light emitting diode, LED 1. Also, on the top surface 18 (FIG. 1) of the upper housing member 12 of the remote control 10, there is provided another light emitting diode, LED 2, by which information be communicated to the user of the remote control 10.

The infra-red light emitting diode LED 1 is held securely in place in the window 30 and is adapted to be aimed at a home entertainment device to be controlled. The diode LED 1 is generally in alignment with diode LED 2 and is coupled to an electrical circuit 36 (FIGS. 4a and 4b) of the remote control 10.

The light-emitting diode LED 2 is generally centrally located for indicating when an individual key 25 is pressed on the remote control 10. The diode LED 2 a visible indicator that the remote control 10 is working. If the diode LED 2 does not light when a key 25 is pressed, the batteries may need to be replaced.

Figure 4A:
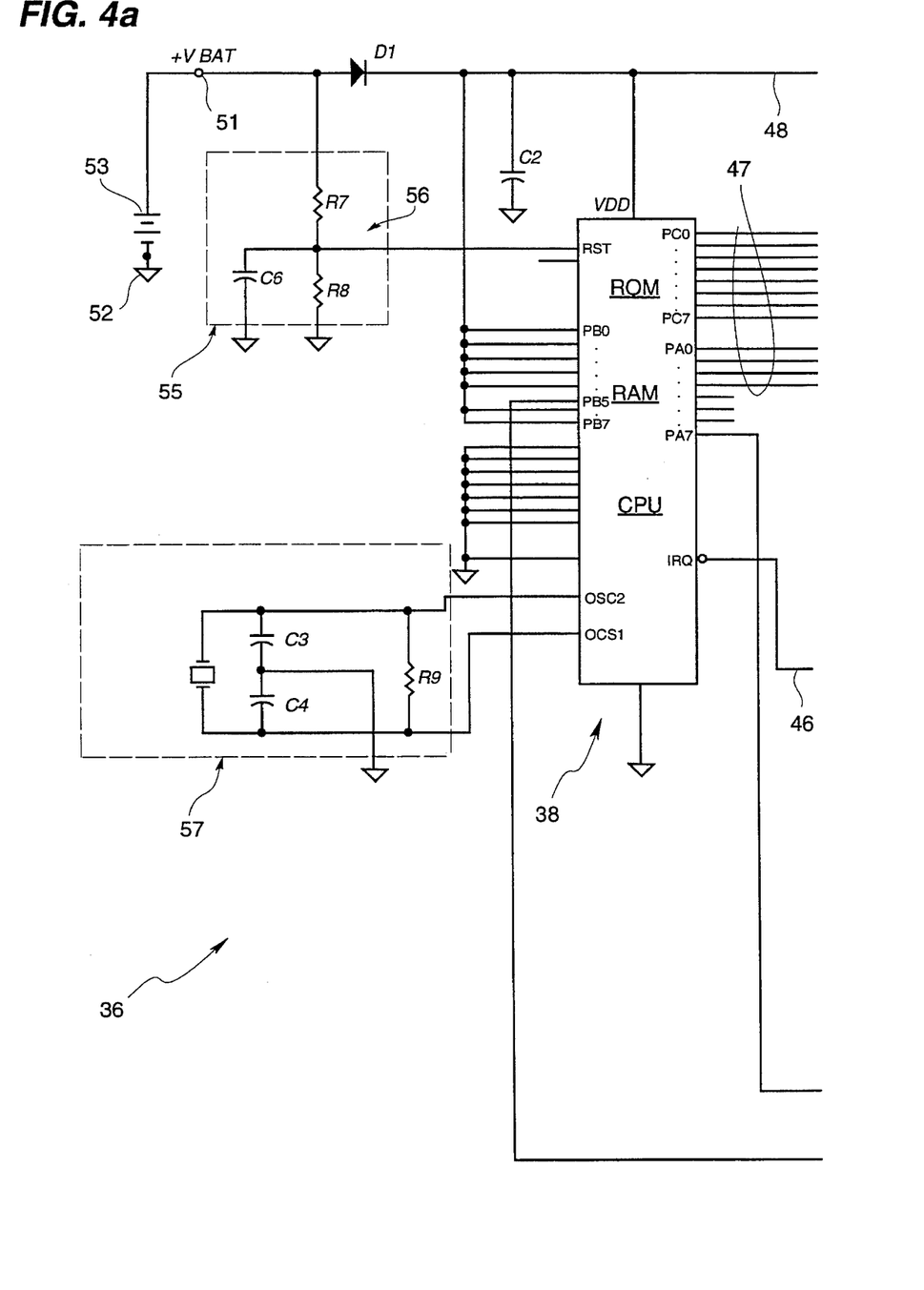
FIGS. 4a and 4b are a schematic circuit diagram of the electrical circuit in the remote control.
Figure 4B:
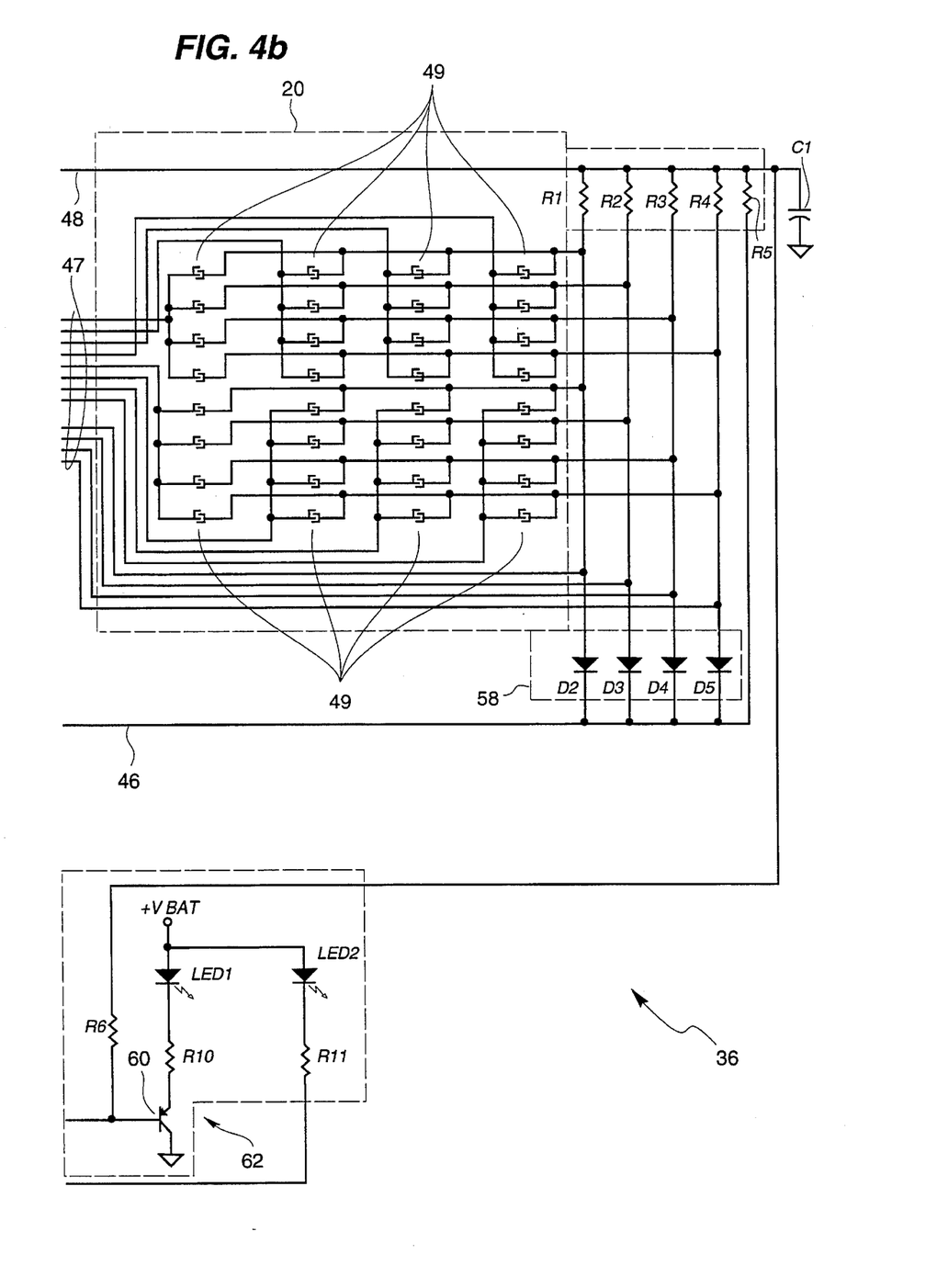

FIGS. 4a and 4b are a block electrical schematic circuit diagram of the electrical operating circuit 36 which is mounted in the remote control 10 and which includes a microprocessor 38, including a RAM, a ROM and a CPU. The keypad 20 is coupled to the microprocessor 38 by an interrupt line 46, a plurality of switch contact lines 47 and a positive voltage supply bus 48 to the CPU.

The keypad 20 has input switch cross-points 49 which are located beneath the keys 25 (FIG. 1) and which are coupled to the CPU for remotely controlling a home entertainment device.

As shown in FIGS. 4a and 4b, each cross point 49 has a unique pair of input ports to the microprocessor 38, to determine which key(s) were pressed to execute a function associated with such key(s).

A power supply in the form of a battery 53 is connected between a + voltage input 51 to the microprocessor 38 and a system ground 52. A backup battery 53 is connected from ground 52 through the input 51 and an isolation diode D1 to a VDD input of the microprocessor 38 to maintain the data stored in the ROM and/or RAM thereby to provide a non-volatile system.

Coupled to a reset input RST of the microprocessor 38 is a reset circuit 55 including a voltage divider 56 for causing the microprocessor 38 to reset and re-initialize itself when battery power is applied.

Power is applied to the microprocessor 38 through the isolation diode D1 to input VDD. Capacitors C1 and C2 provide power supply filtering for the power line.

An oscillator circuit 57 provides a clock frequency for the microprocessor 38.

The circuit 36 includes pull up resistors R1–R5, to keep the input ports and the IRQ line to the microprocessor 38 at a known state when the keys 25 are not depressed. The circuit 36 further includes isolation diodes D2–D5, providing an "or" logic function circuit 58 for isolating each line from the other while not inhibiting communication to the IRQ input of the microprocessor 38. Each diode D2–D5 prevents action in one line from spurious indicating action on another line, while still permitting each line individually to send a signal to the IRQ input of the microprocessor 38.

The microprocessor 38 includes an output PB5 to the light emitting diode LED 2 to indicate when a key 25 has been pushed and the circuit 36 is sending an infra-red signal through infra-red light emitting diode LED 1. The microprocessor 38 also includes an output PA7 to a transistor 60 of an IR lamp driver circuit 62, which outputs a voltage to the light emitting diodes LED 1 and LED 2, for allowing a signal to flow through the transistor 60, and activate the infra-red light emitting diode LED 1 for controlling an home entertainment device.

According to the teachings of the present invention the remote control 10 is provided with the SCAN key 28 (FIG. 1) by which the channel scan function of the present invention is initiated.

It is to be noted that the electrical circuit 36 is generally of the type disclosed in greater detail in the Darbee et al U.S. Pat. No. 4,959,810, of which this application is a continuation-in-part and the disclosure of which is incorporated herein by reference.

The operating program for the remote control 10 which is stored in the ROM or RAM is very similar to the operating program disclosed in the Darbee et al U.S. Pat. No. 4,959,810 which is incorporated herein by reference.

Figure 5:
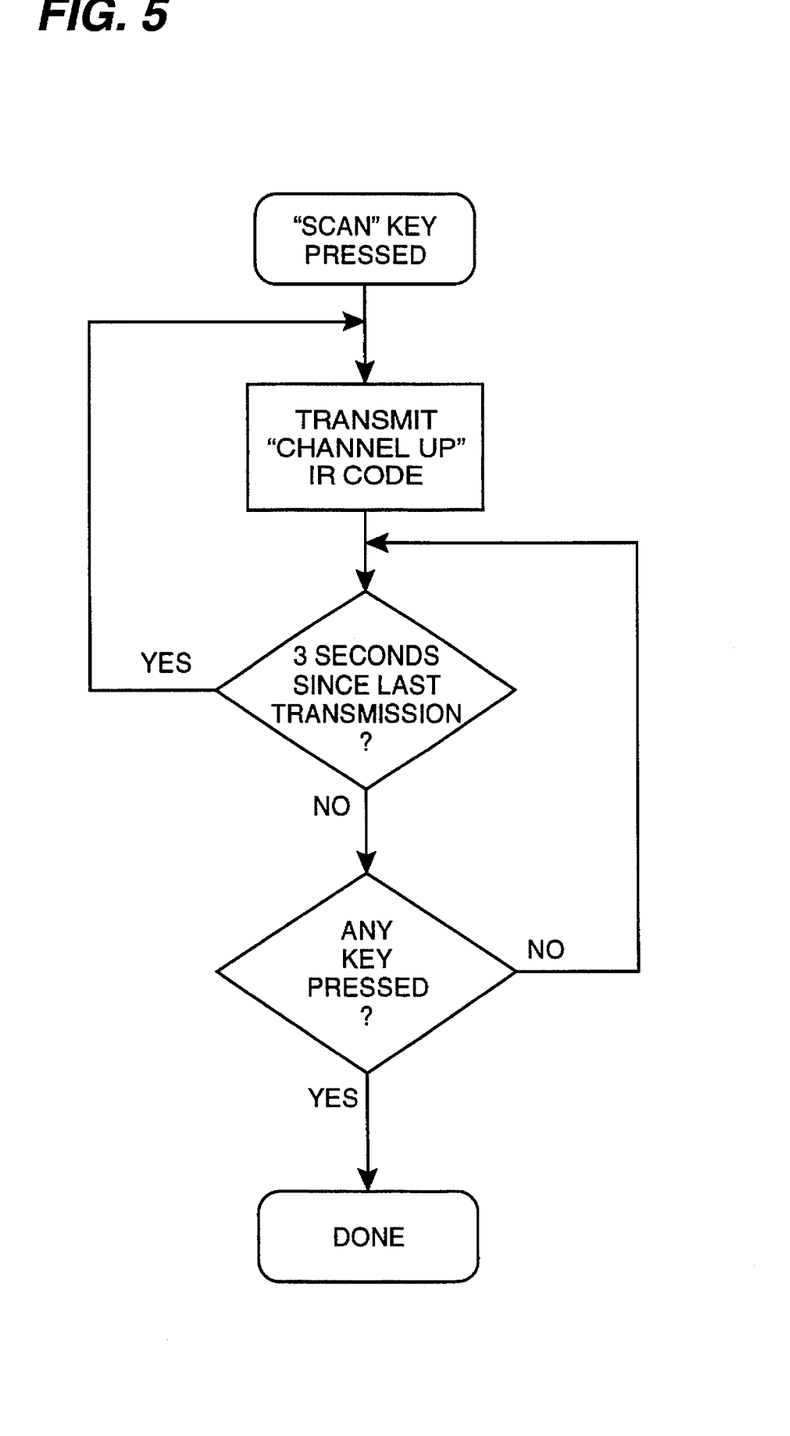
FIG. 5 is a flow chart of the steps performed by one embodiment of the channel scan software of the present invention which is incorporated into a remote control which has channel "up" and channel "down" keys already supporting a channel up and channel down function.

Referring now to FIG. 5 there is illustrated therein a flow chart of the steps performed by one embodiment of the channel scan software/program of the present invention which is incorporated into a remote control 10 which already has channel "UP" and channel "DOWN" keys supporting a channel up and channel down function and which has incorporated therein the SCAN key 28 which is operated by the user of the remote control 10 for effecting an automatic channel scan according to the teachings of the present invention.

As shown, at the initial step, the SCAN key 28 is pressed which causes the remote control 10 to transmit "channel up" IR code.

Then the question is asked, "Have three seconds elapsed since the last transmission?" If the answer is yes, the program loops back to the previous step and repeats the just described procedure.

If the answer is no, another question is asked, "Has any key been pressed?" If the answer is no the program loops back to the previous question.

If the answer is yes, the program is completed and the program exits to DONE.

Figure 6:
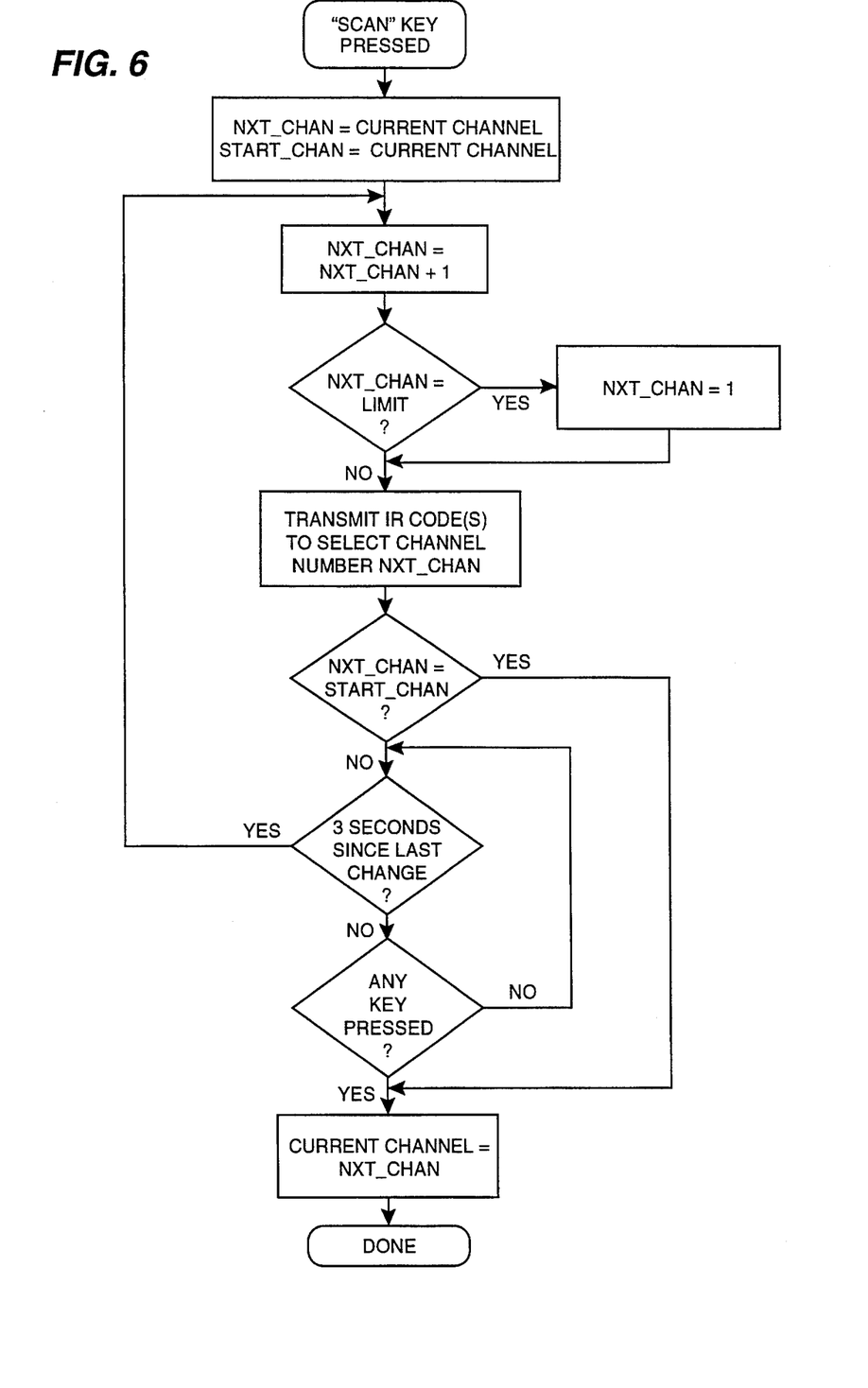
FIG. 6 is a flow chart of a another embodiment of the channel scan software of the present invention for use in a remote control which does not have channel "up" or channel "down" keys and which effects the sending of direct channel digit commands to a television set every few seconds.

Referring now to FIG. 6 there is illustrated therein a flow chart of another embodiment of the channel scan software of the present invention for use in a remote control which does not have channel "up" or channel "down" keys and which effects the sending of direct channel digit commands to a television set every few seconds. Here the remote control 10 has the SCAN key 28 but does not have the channel "up" and channel "down" keys shown in FIG. 1. The channel scan software/program, however, emulates the automatic scanning provided with the channel scan software and the SCAN key 28 described above in connection with the description of FIG. 5 by sending IR codes for direct channel digit commands every three seconds in an ascending sequence.

In a universal remote control the selection of which program format to use (FIG. 5 or FIG. 6) will be automatic based on whether the currently configured remote control supports the channel "up" or channel "down" function.

As shown in FIG. 6 the SCAN key 28 is first pressed and the next channel is set equal to the current channel and the start channel is set equal to the current channel.

Then, at the next step, the next channel is set to equal the next channel plus one. Then the question is asked, "Is the next channel equal to the limit or last channel?". If the answer is yes, then the next channel is set equal to one.

The program then instructs the remote control to transmit the IR codes for selecting the channel number for the next channel. Then a question is asked, "Is the next channel the start channel?". If the answer is yes, the program loops down to the of setting the current channel equal to the next channel step.

If the answer is no, the question is asked, "Have three seconds elapsed since the last channel change? ". If the answer is yes, the program loops back to the second step where the next channel is sit equal to the next channel number plus one.

If the answer is no, the program asks the question, "Has any key been pressed?". If the answer is no, the program loops back to the previous question of: "Have three seconds elapsed since the last channel change?".

The program sets the current channel equal to the next channel and exits to DONE.

Figures 7, 8:
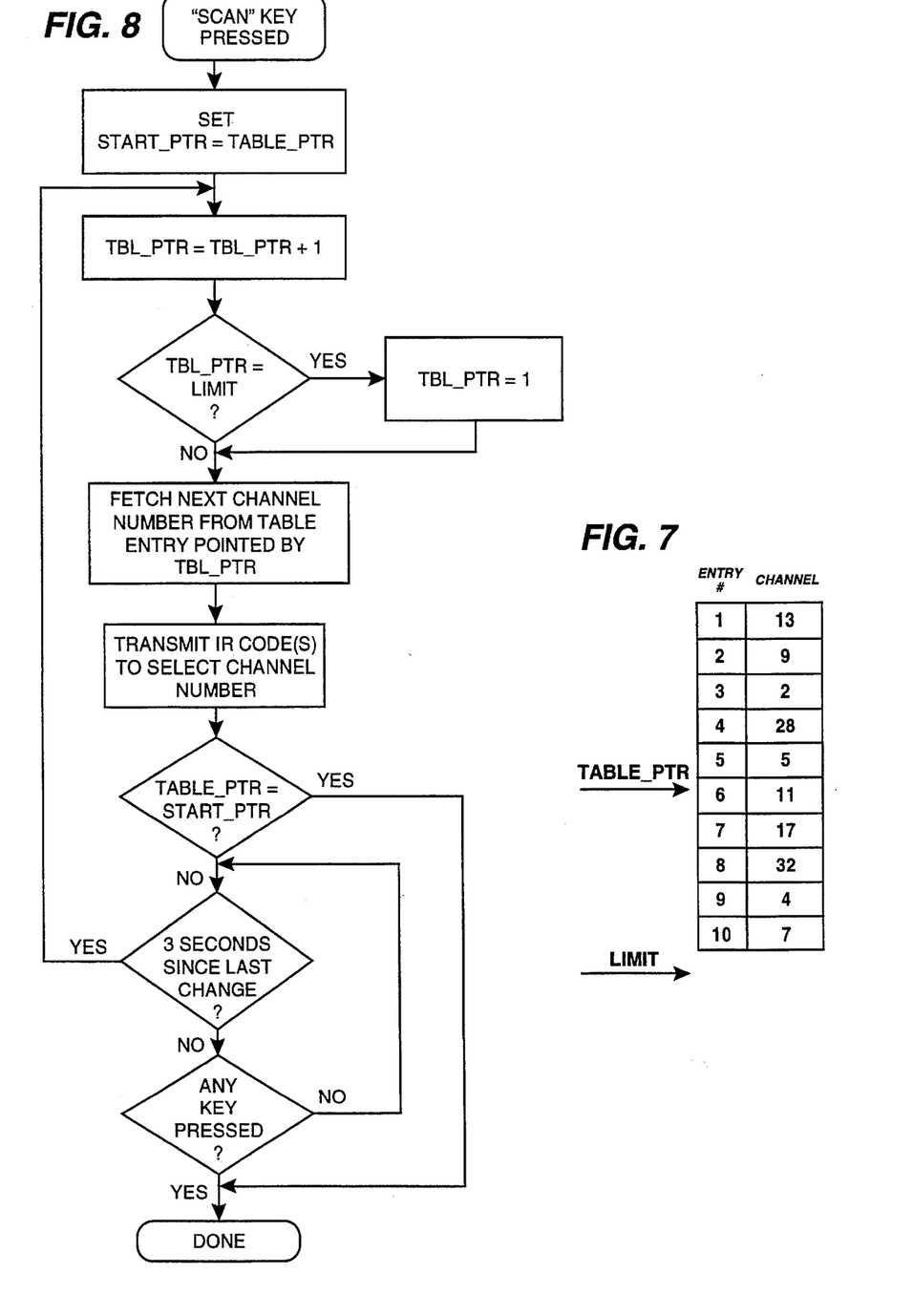
FIG. 7 is a table showing an example of a favorite channel scan where the channel digit entry numbers have been set to correspond to certain favorite channels.
FIG. 8 is a flow chart of a third embodiment of the channel scan software of the present invention similar to the flow chart shown in FIG. 6 but including a list of "favorite" channels preset by the user for scanning.

Referring now to FIG. 7 there is illustrated therein a table of a list of favorite channels in the order of preference of a user. Here digit key one has been set to cause the remote control 10 to transmit the IR code for channel 13, digit two, to emit the IR code for channel 9, and so on as illustrated in FIG. 7.

Changing the IR code to be transmitted by a given digit key to the IR code associated with another digit key easily be accomplished by incorporating into the remote control 10 the software/program disclosed in U.S. application Ser. No. 07/990,854 filed Dec. 11, 1992 and entitled: KEY MOVER.

Referring now to FIG. 8, there is illustrated therein a flow chart of a third embodiment of the channel scan software of the present invention similar to the flow chart shown in FIG. 6 but including the list of "favorite" channels (See the Table of FIG. 7) preset by the user which are scanned by the channel scan software.

In carrying out the steps of the program, first the SCAN key 28 is pressed. This then sets the start pointer equal to the table pointer for the Table shown in FIG. 7. Then the table pointer equals the table pointer plus one.

Next the question is asked, "Is the table pointer now equal to limit?" If the answer is yes, the table pointer is set to equal one. If the answer is no, then the next favorite channel number associated with the sequential entry digit number pointed at by the table pointer is fetched. Then the IR codes for selecting the next favorite channel is transmitted by the remote control 10.

Then the question is asked "Does the table pointer equal the start pointer?" If the answer is yes, the program loops to exit at DONE. If the answer is no, the program asks, "Have three seconds elapsed since the last channel change?" If the answer is yes, the program loops back to the second step of setting the table pointer equal to the table pointer plus one.

If the answer is no, the question is asked, "Has any key been pressed?". If the answer to this question is no, the program loops back to the previous question, "Has three seconds elapsed. . ."

If the answer was yes, i.e., that a key has been pressed, then the program exits to DONE.

From the foregoing description, it will be apparent that the remote control 10, with the SCAN key 28 and the channel scan software stored therein, of the present invention has a number of advantages, some of which have been described above and others of which are inherent in the invention. Also, it will be understood that modifications be made to the remote control 10 and the channel scan software therein and described above without departing from the teachings of the invention. Accordingly, the scope of the invention is only to be limited as necessitated by the accompanying claims.

I claim:

1. A remote control for selecting a channel in a controlled home entertainment device comprising:

a microprocessor including a CPU and memory means;

a keypad including keys for operating said remote control coupled to said microprocessor;

lamp driver circuitry coupled to said microprocessor;

means, including said microprocessor, for generating infrared (IR) signals coupled to said IR lamp driver circuitry;

code data for executing command functions for operating a home entertainment device stored in said memory means;

said keys including a SCAN key;

circuit means for coupling said SCAN key to said microprocessor; and a channel scan program stored in said memory means for effecting a channel scan of channels that can be selected by periodically and sequentially incrementing the channel selected when said SCAN key is depressed.

2. The remote control of claim 1 wherein said keypad includes "channel up" and "channel down" keys.

3. The remote control of claim 1 wherein said microprocessor and said channel scan program include circuit means and program instructions for execution upon depression of said SCAN key, said program instructions including:

transmitting a "channel up" IR code;

determining if a predetermined time period has elapsed after the previously transmitted IR code has been sent,
if yes, looping back to the program instruction of transmitting a "channel up" IR code; and determining if any key has been pressed indicating a channel selection by the user,
if no, looping back to the program instruction of determining if a predetermined time period has elapsed after the previously transmitted IR code has been sent,
if yes, exiting said program instructions.

4. The remote control of claim 3 wherein said time period is three seconds.

5. The remote control of claim 3 wherein said program instruction, transmitting a "channel up" IR code, can transmit a "channel down" IR code in place of said "channel up" IR code.

6. The remote control of claim 1 wherein said microprocessor and said channel scan program include circuit means and program instructions for execution upon depression of said SCAN key, said program instructions including:

(a) setting a next channel equal to the current channel and a start channel equal to the current channel;

(b) setting said next channel equal to said next channel plus one;

(c) determining if said next channel is equal to a limit channel, if yes, setting said next channel equal to channel one;

(d) transmitting the IR codes required to select the channel number for said next channel;

(e) determining if said next channel equals said start channel, if yes, looping forward to (h) to set the current channel equal to said next channel;

(f) determining if a predetermined time period has elapsed after the previously transmitted IR code has been sent, if yes, looping back to (b) to set said next channel equal to said next channel plus one;

(g) determining if any key has been pressed indicating a channel selection by the user, (i) if no, looping back to (f) to determine if a predetermined time period has elapsed after the previously transmitted IR code has been sent;

(h) setting the current channel equal to said next channel; and (i) exiting said program instructions.

7. The remote control of claim 6 wherein said time period is three seconds.

8. The remote control of claim 6 wherein said keypad does not include "channel up" and "channel down" keys.

9. The remote control of claim 6 wherein said program instruction (b) can be set to said next channel equal to said next channel minus one, in place of said next channel plus one; and wherein said program instruction (c) determining if said next channel is equal to a limit channel and if yes, setting said next channel equal to the highest tunable channel, in place of channel one.

10. The remote control of claim 1 wherein said microprocessor and said channel scan program include circuit means and program instructions including instructions for establishing a table of favorite channels and instructions for execution upon depression of said SCAN key:

wherein said instructions for establishing a table of favorite channels include;

enabling entering of a predetermined keystroke sequence on the keypad;

determining if the predetermined keystroke sequence is a command to perform special function processing to reassign to a key a function of a device to be controlled;

determining if a function key has been depressed;

storing the key identity and current mode into a "FROM" entry in a Key Reassignment Table in said microprocessor;

determining if the next key depressed is a mode key;

setting the new mode;

determining if a function sequence of keystrokes has been entered on the keypad for a valid function for the device and mode selected;

obtaining device data format and command function data corresponding to the function and mode selected from the Key Reassignment Table;

storing the data in a "TO" entry in the Key Reassignment Table; and enabling repeating of the above instructions to establish in a table, including a table pointer, a table pointer limit, and an order for scanning "favorite channels"; and, wherein said instructions for execution upon depression of said SCAN keys include;

setting a start pointer equal to said table pointer;

setting said table pointer equal to said table pointer plus one;

determining if the table pointer equals said table pointer limit, if yes, set said table pointer equal to table entry number one, fetching a selected channel number from a table entry pointed to by said table pointer; transmitting the IR code(s) for said selected channel number;

determining if said table pointer equals said start pointer, if yes, exiting the program; determining if a predetermined time period has elapsed after the previously transmitted IR code has been sent, if yes, looping back to the program instruction of setting said table pointer equal to said table pointer plus one; and determining if any key has been pressed indicating a channel selection by the user, if no, looping back to the program instruction of determining if a predetermined time period has elapsed after the previously transmitted IR code has been sent, if yes, exiting said program instructions.

11. The remote control of claim 10 wherein said time period is three seconds.

12. The remote control of claim 10 wherein said keypad does not include "channel up" and "channel down" keys.

13. The remote control of claim 10 wherein said command to perform special function processing reassigns a digit key for a selected channel.

14. A method of performing a channel scan by a remote control having a SCAN key, comprising the steps of:

depressing the SCAN key, transmitting a "channel up" IR code;

determining if a predetermined time period has elapsed after the previously transmitted IR code has been sent;

determining if any key has been pressed; and, if not, transmitting an additional "channel up" IR code after each predetermined time period interval has elapsed until a key is depressed indicating a channel selection by the user.

15. A method of performing a channel scan by a remote control having a SCAN key, comprising the steps of:

(a) upon the depression of said SCAN key, setting a next channel equal to the current channel and a start channel equal to the current channel;

(b) setting said next channel equal to said next channel plus one;

(c) determining if said next channel is a limit channel;

if yes, setting said next channel equal to channel one;

(d) transmitting the IR codes required to select the channel number for said next channel;

(e) determining if said next channel equals the start channel, if yes, looping forward to (h) to set the current channel equal to said next channel;

(f) determining if a predetermined time period has elapsed after the previously transmitted IR code has been sent, if yes, looping back to (b) to set said next channel equal to said next channel plus one;

(g) determining if any key has been pressed, indicating a channel selection by the user, if no, looping back to (f) to determine if a predetermined time period has elapsed after the previously transmitted IR code has been sent;

(h) setting the current channel equal to said next channel; and (i) ending the channel scan.

16. A method of performing a channel scan by a remote control having a keypad, having keys including a SCAN key, comprising the steps of:

entering of a predetermined keystroke sequence on the keypad;

determining if the predetermined keystroke sequence is a command to perform special function processing to reassign to a key a function of a device to be controlled;

determining if a function key has been depressed;

storing the key identity and current mode into a "FROM" entry in a Key Reassignment Table in said microprocessor;

determining if the next key depressed is a mode key;

setting the new mode;

determining if a function sequence of keystrokes has been entered on the keypad for a valid function for the device and mode selected;

obtaining device data format and command function data corresponding to the function and mode selected from the Key Reassignment Table;

storing the data in a "TO" entry in the Key Reassignment Table;

enabling repeating of the above steps to establish in a table, including a table pointer, a table pointer limit, and an order for scanning "favorite channels";

and upon depressing of the SCAN key, setting a start pointer equal to said table pointer;

setting said table pointer equal to said table pointer plus one;

determining if the table pointer equals said table pointer limit, if yes, setting said table pointer equal to table entry number one;

fetching a selected channel number from a table entry pointed to by said table pointer;

transmitting the IR code(s) for said selected channel number;

determining if said table pointer equals said start pointer, if yes, ending the channel scan;

determining if a predetermined time period has elapsed after the previously transmitted IR code has been sent, if yes, looping back to setting said table pointer equal to said table pointer plus one;

determining if any key has been pressed indicating a channel selection by the user, if no, looping back to determining if a predetermined time period has elapsed after the previously transmitted IR code(s) has been sent; and ending the channel scan.

17. The method of performing a channel scan of claim 16 wherein said command to perform special function processing reassigns a digit key for a selected channel.

* * * * *